(12) United States Patent
Koya

(10) Patent No.: US 10,523,161 B2
(45) Date of Patent: *Dec. 31, 2019

(54) POWER AMPLIFICATION MODULE

(71) Applicant: Murata Manufacturing Co., Ltd., Kyoto (JP)

(72) Inventor: Shigeki Koya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/995,202

(22) Filed: Jun. 1, 2018

(65) Prior Publication Data

US 2018/0287571 A1 Oct. 4, 2018

Related U.S. Application Data

(63) Continuation of application No. 15/413,763, filed on Jan. 24, 2017, now Pat. No. 10,014,832.

(30) Foreign Application Priority Data

Apr. 21, 2016 (JP) ................................. 2016-085355

(51) Int. Cl.
*H03F 3/191* (2006.01)
*H03F 1/56* (2006.01)
*H03F 1/02* (2006.01)
*H03F 3/19* (2006.01)
*H03F 3/21* (2006.01)
(Continued)

(52) U.S. Cl.
CPC ........... *H03F 1/565* (2013.01); *H03F 1/0211* (2013.01); *H03F 1/3205* (2013.01); *H03F 3/19* (2013.01); *H03F 3/21* (2013.01); *H03F 3/217* (2013.01); *H03F 3/2176* (2013.01); *H03F 3/245* (2013.01); *H03F 2200/381* (2013.01); *H03F 2200/387* (2013.01); *H03F 2200/391* (2013.01); *H03F 2200/451* (2013.01)

(58) Field of Classification Search
CPC ........ H03F 1/565; H03F 3/2176; H03F 3/217; H03F 1/3205; H03F 3/245; H03F 3/21; H03F 3/19; H03F 1/0211
USPC .......................... 330/302, 304, 127, 296, 305
See application file for complete search history.

(56) References Cited

U.S. PATENT DOCUMENTS 9,083,282 B2   7/2015 Zhang et al.
2010/0069025 A1   3/2010 Takinami et al.
(Continued)

*Primary Examiner* — Khanh V Nguyen
*Assistant Examiner* — Khiem D Nguyen
(74) *Attorney, Agent, or Firm* — Pearne & Gordon LLP

(57) ABSTRACT

A power amplification module includes: an amplifier that amplifies an input signal and outputs an amplified signal; and a harmonic-termination circuit to which harmonics of the amplified signal are input and the impedance of which is controlled in accordance with the frequency of a harmonic. The power amplification module can operate in a first mode in which a power supply voltage changes in accordance with the average voltage value of the amplified signal over a prescribed time period or in a second mode in which the power supply voltage changes in accordance with the envelope of the input signal. The impedance of the harmonic-termination circuit is controlled such that at least one even-ordered harmonic is short-circuited when the power amplification module operates in the first mode and at least one odd-ordered harmonic of third order or higher is short-circuited when the power amplification module operates in the second mode.

14 Claims, 7 Drawing Sheets

(51) Int. Cl.
*H03F 1/32* (2006.01)
*H03F 3/217* (2006.01)
*H03F 3/24* (2006.01)

(56) References Cited

U.S. PATENT DOCUMENTS

2010/0308933 A1 12/2010 See et al.
2012/0001693 A1 1/2012 Magoon et al.
2014/0111178 A1 4/2014 Klat et al.

POWER AMPLIFICATION MODULE

This is a continuation of U.S. patent application Ser. No. 15/413,763 filed on Jan. 24, 2017, which claims priority from Japanese Patent Application No. 2016-085355 filed on Apr. 21, 2016. The contents of these applications are incorporated herein by reference in its entirety.

BACKGROUND

Technical Field

The present disclosure relates to power amplification modules. Power amplification modules are used in mobile communication devices such as cellular phones in order to amplify the power of a radio frequency (RF) signal to be transmitted to a base station. There is a demand for the power adding efficiency of such power amplification modules to be improved.

For example, U.S. Patent Application Publication No. 2010/0308933 discloses a configuration that improves the power adding efficiency of a power amplifier by adjusting the characteristics of a matching network provided on the output side of the power amplifier in accordance with, for example, the output power of the power amplifier.

Such power amplification modules have various operation modes for increasing the power adding efficiency thereof such as an average power tracking (APT) mode and an envelope tracking (ET) mode and power amplifiers need to have different specifications in order to operate in these operation modes. For example, in the APT mode, the power supply voltage is controlled in accordance with the average value of the output voltage over a prescribed period of time. Therefore, since the power supply voltage does not vary within the prescribed period of time, it is required that the power amplifier have linearity of a prescribed level or higher. On the other hand, in the ET mode, the power supply voltage is controlled in accordance with the envelope of an input signal. Therefore, the power supply voltage is better able to track the level of the input signal in the ET mode and it is not necessary for a power amplifier to have the same level of linearity in the ET mode as in the APT mode.

Regarding the characteristics of the power amplifier, the impedance of the power amplifier is controlled with respect to the fundamental wave in the configuration disclosed in U.S. Patent Application Publication No. 2010/0308933, but the impedance of the power amplifier is not controlled with respect to harmonics of the input signal and is not controlled with respect to the operation mode of the power amplifier. However, when power amplifiers are designed so as to be specially configured for the various operations modes, there are problems in that there is an increase in design cost and the number of products and expense increase.

BRIEF SUMMARY

The present disclosure was made in light of the above-described circumstances and the present disclosure provides a power amplification module that can control the characteristics of a power amplifier in accordance with an operation mode.

A power amplification module according to an embodiment of the present disclosure includes: an amplifier that amplifies an input signal and outputs an amplified signal; and a harmonic-termination circuit to which harmonics of the amplified signal are input and an impedance of which is controlled in accordance with a frequency of a harmonic. The power amplification module can operate in a first mode in which a power supply voltage changes in accordance with an average value of a voltage of the amplified signal over a prescribed time period or in a second mode in which the power supply voltage changes in accordance with a waveform of an envelope of the input signal. The impedance of the harmonic-termination circuit is controlled such that at least one even-ordered harmonic among the harmonics is short-circuited when the power amplification module operates in the first mode and the impedance of the harmonic-termination circuit is controlled such that at least one odd-ordered harmonic of third order or higher among the harmonics is short-circuited when the power amplification module operates in the second mode.

According to the embodiment of the present disclosure, the characteristics of a power amplifier can be controlled in accordance with an operation mode. Thus, a power amplification module can be provided that has characteristics that are suitable for the operation mode being used.

Other features, elements, characteristics and advantages of the present disclosure will become more apparent from the following detailed description of embodiments of the present disclosure with reference to the attached drawings.

DETAILED DESCRIPTION

Figure 1:
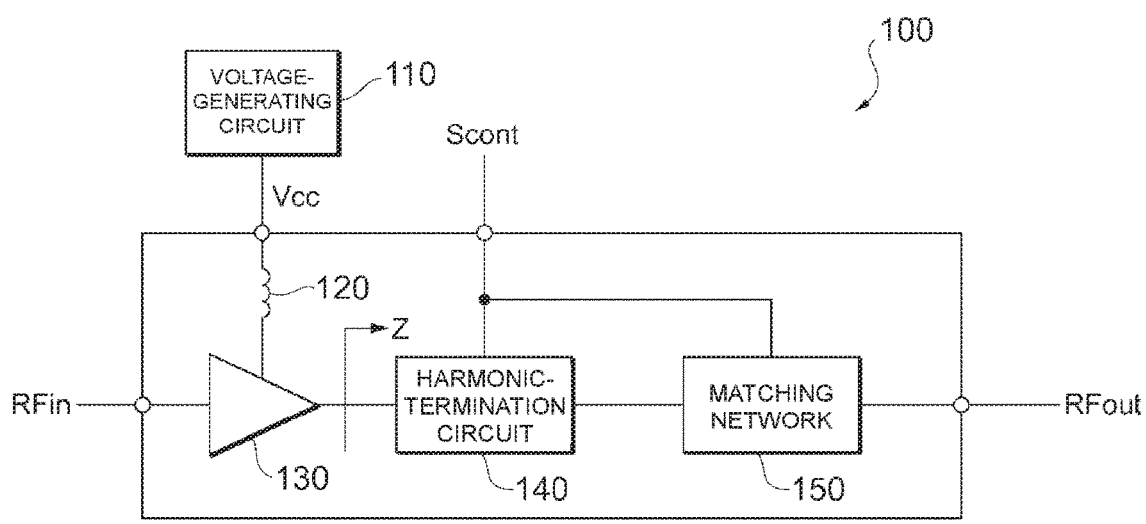
FIG. 1 illustrates the configuration of a power amplification module according to an embodiment of the present disclosure.

Hereafter, an embodiment of the present disclosure will be described while referring to the drawings. FIG. 1 illustrates the configuration of a power amplification module 100 according to an embodiment of the present disclosure. The power amplification module 100 amplifies an input signal RFin which has been input thereto and outputs an amplified signal RFout, in a mobile communication device such as a cellular phone, for example. The frequency of the input signal RFin is around several GHz, for example.

As illustrated in FIG. 1, the power amplification module 100 includes a voltage-generating circuit 110, an inductor 120, an amplifier 130, a harmonic-termination circuit 140 and a matching network 150.

The voltage-generating circuit 110 generates a power supply voltage Vcc of a prescribed level and supplies the generated power supply voltage Vcc to the amplifier 130 via the inductor 120. In order to improve the power adding efficiency of the power amplification module 100, the voltage-generating circuit 110 changes the value of the power supply voltage Vcc in accordance with the operation mode of the power amplification module 100 prior to outputting the power supply voltage Vcc. The operation mode may be an average power tracking (APT) mode (first mode) in which the power supply voltage Vcc is controlled in accordance with the average value of the voltage of the amplified signal RFout over a prescribed period of time or may be an envelope tracking (ET) mode (second mode) in which the power supply voltage Vcc is controlled in accordance with the envelope of the input signal RFin, for example. The power amplification module 100 can be used in both of these modes.

The amplifier 130 is a circuit for amplifying the input signal RFin and is formed of an amplification transistor. The amplification transistor is a metal-oxide-semiconductor field effect transistor (MOSFET), for example. Alternatively, a bipolar transistor such as a heterojunction bipolar transistor (HBT) may be used as the amplification transistor.

The harmonic-termination circuit 140 is connected to an output terminal of the amplifier 130 and processes harmonics contained in the amplified signal RFout output from the amplifier 130. The input impedance of the harmonic-termination circuit 140 is adjusted in accordance with a control signal Scont (first control signal) supplied from the outside such that a prescribed harmonic among the harmonics is short-circuited and the other harmonics experience an open circuit. Specifically, the input impedance of the harmonic-termination circuit 140 is adjusted such that an even-ordered harmonic is short-circuited and an odd-ordered harmonic experiences an open circuit or such that an even-ordered harmonic experiences an open circuit and an odd-ordered harmonic is short-circuited.

The matching network 150 matches the output impedance (for example, around several Ω) of the amplifier 130 of a first stage and the input impedance of a second stage (for example, around 50Ω) with respect to the fundamental wave of the amplified signal RFout in accordance with a control signal Scont (second control signal).

The harmonic-termination circuit 140 and the matching network 150 control an input impedance Z seen from the output terminal of the amplifier 130 in accordance with the control signal Scont. The specific method of controlling the input impedance Z will be described later. The order in which the harmonic-termination circuit 140 and the matching network 150 are arranged is not limited to the illustrated order and the harmonic-termination circuit may be provided in a stage subsequent to the matching network. Alternatively, the harmonic-termination circuit 140 may be included in the matching network 150.

Next, operation of the power amplification module 100 will be described. The amplifier 130 of the power amplification module 100 is configured to operate so as to satisfy the required specifications for an operation mode such as the APT mode or the ET mode. Specifically, the amplifier 130 can perform class-F operation or inverse-class-F operation. Class-F operation and inverse-class-F operation will be described while referring to FIGS. 2A to 3.

Figure 2A:
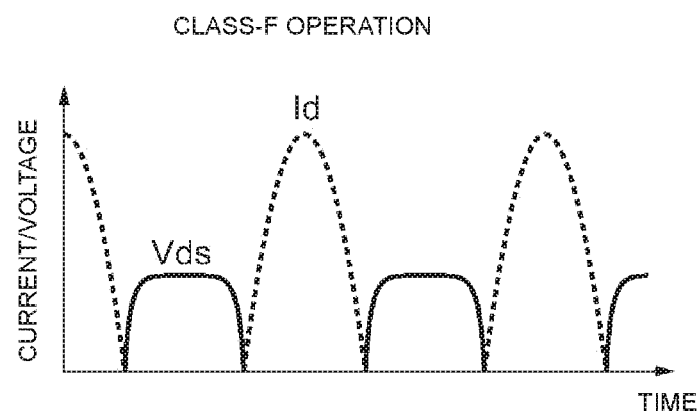
FIG. 2A illustrates voltage and current waveforms of an amplifier for a case where the amplifier is made to perform class-F operation.
Figure 2B:
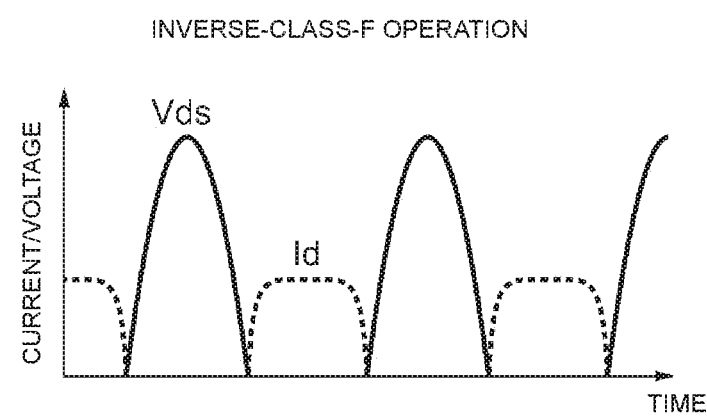
FIG. 2B illustrates voltage and current waveforms of the amplifier for a case where the amplifier is made to perform inverse-class-F operation.

FIGS. 2A and 2B illustrate waveforms of the voltage (solid line) and the current (broken line) of the amplifier 130 in cases where the amplifier 130 is made to perform class-F operation and inverse-class-F operation, respectively. For example, when the amplifier 130 is formed of a MOSFET, the waveform of a current Id that flows through the drain of the MOSFET and the waveform of a drain-source voltage Vds of the MOSFET do not overlap in either class-F operation or inverse-class-F operation (refer to FIGS. 2A and 2B). Therefore, the power consumption of the amplifier 130 (=current Id×voltage Vds) is ideally 0 W. Therefore, the power adding efficiency of the power amplification module is improved in both class-F operation and inverse-class-F operation.

Furthermore, as illustrated in FIG. 2A, in the class-F operation, the current Id is a half-wave rectified wave and the voltage Vds is a square wave. In contrast, as illustrated in FIG. 2B, in inverse-class-F operation, the current Id is a square wave and the voltage Vds is a half-wave rectified wave. Therefore, regarding the harmonics output by the amplifier 130, the amplifier 130 performs class-F operation as a result of the input impedance of the harmonic-termination circuit 140 being controlled such that even-ordered harmonics are short-circuited and odd-ordered harmonics of the third order or higher experience an open circuit. On the other hand, the amplifier 130 performs inverse-class-F operation as a result of the input impedance of the harmonic-termination circuit 140 being controlled such that odd-ordered harmonics are short-circuited and even-ordered harmonics experience an open circuit.

Figure 3:
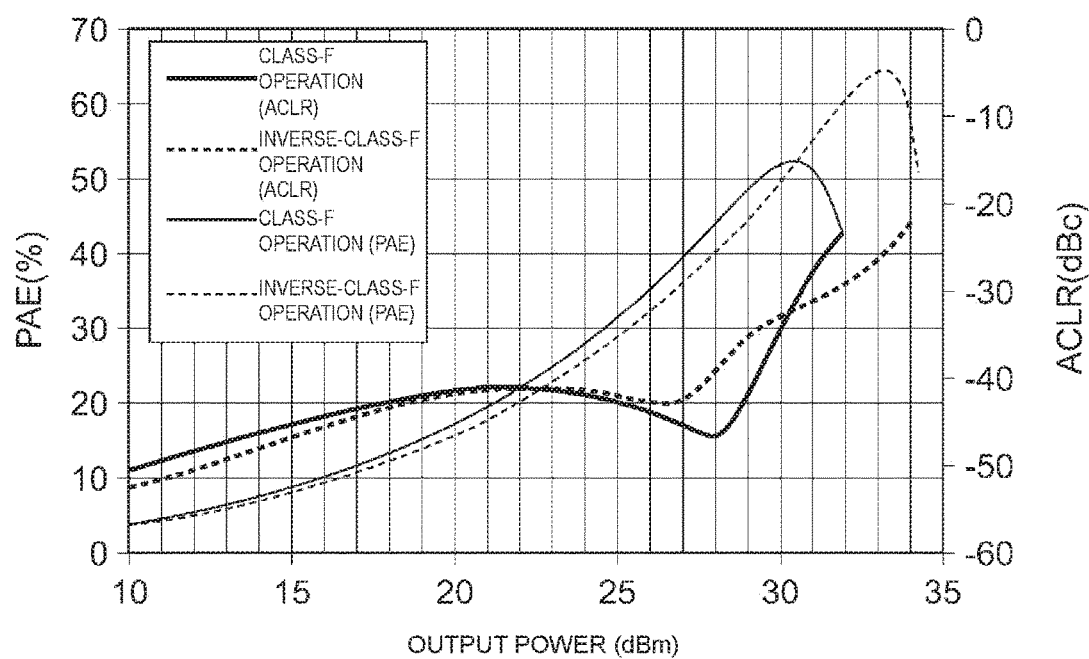
FIG. 3 depicts a graph illustrating simulation results of adjacent channel leakage power ratio (ACLR) and power adding efficiency (PAE) for cases where the amplifier is made to perform class-F operation and inverse-class-F operation.

FIG. 3 depicts a graph illustrating simulation results of adjacent channel leakage power ratio (ACLR) and power adding efficiency (PAE) for cases where the amplifier 130 is made to perform class-F operation and inverse-class-F operation. The impedance with respect to the fundamental wave is the same in both operations, and the second-order harmonic is short-circuited in class-F operation and the third-order harmonic is short-circuited in inverse-class-F operation. In addition, the vertical axis of the graph represents ACLR (dBc) and PAE (%) and the horizontal axis of the graph represents the output power (dBm) of the amplifier 130. As illustrated in FIG. 3, regarding ACLR, it is clear that ACLR is lower and the output signal has better distortion characteristics in class-F operation than in inverse-class-F operation when the output power is high (for example, around 25 dBm to 30 dBm). On the other hand, regarding PAE, it is clear that the saturation efficiency is higher in inverse-class-F operation than in class-F operation.

Here, in the APT mode, the power supply voltage Vcc is controlled in accordance with the average value of the voltage of the amplified signal RFout over a prescribed period of time and therefore the power supply voltage Vcc does not vary within this prescribed time period. Consequently, in the APT mode, it is demanded that the amplifier have linearity of a prescribed level or higher. Therefore, in the APT mode, for example, the amplifier 130 can be made to perform class-F operation, which has better linearity than inverse-class-F operation when the output power is high. On the other hand, in the ET mode, since the power supply voltage Vcc continually varies in accordance with the envelope of the input signal RFin, the power supply voltage Vcc instantaneously rises and the linearity is maintained when the power of the input signal RFin is high. Therefore, in the ET mode, for example, the amplifier 130 can be made to operate using inverse-class-F operation in which the saturation efficiency is high. In other words, harmonics of the amplified signal RFout can be processed such that the amplifier 130 performs class-F operation in the APT mode and performs inverse-class-F operation in the ET mode.

In this embodiment, as described above, the harmonic-termination circuit 140 can process the harmonics such that even-ordered harmonics are short-circuited and odd-ordered harmonics experience an open circuit or such that even-ordered harmonics experience an open circuit and odd-ordered harmonics are short-circuited. Therefore, the amplifier 130 can be controlled to perform class-F operation by short-circuiting even-ordered harmonics and letting odd-ordered harmonics experience an open circuit. On the other hand, in the ET mode, the amplifier 130 can be controlled to perform inverse-class-F operation by letting even-ordered harmonics experience an open circuit and short-circuiting odd-ordered harmonics. Next, examples of specific configurations of the harmonic-termination circuit 140 and the matching network 150 will be described while referring to FIG. 4.

Figure 4:
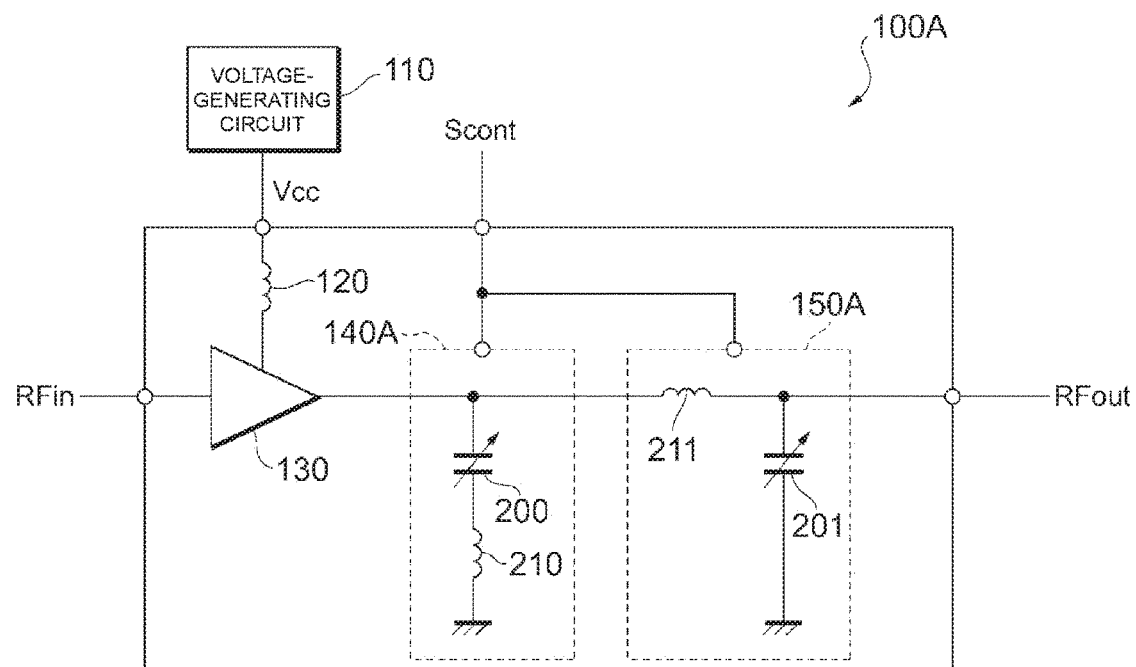
FIG. 4 illustrates an example of the configuration of the power amplification module.

FIG. 4 illustrates an example of the configuration of the power amplification circuit 100 according to an embodiment of the present disclosure (power amplification circuit 100A). In the power amplification module 100A, specific examples of the configurations of the harmonic-termination circuit 140 and the matching network 150 illustrated in FIG. 1 are illustrated.

A harmonic-termination circuit 140A includes a capacitor 200 and an inductor 210 and forms an LC series resonant circuit. Specifically, one end of the capacitor 200 (first capacitor) is connected to the output terminal of the amplifier 130 and the other end of the capacitor 200 is connected to one end of the inductor 210. The one end of the inductor 210 (first inductor) is connected to the other end of the capacitor 200 and the other end of the inductor 210 is grounded. The capacitor 200 is configured such that the capacitance of the capacitor 200 can be changed in accordance with the control signal Scont. The order in which the capacitor 200 and the inductor 210 are connected is not limited to the illustrated order and a configuration may instead be adopted in which the inductor is connected to the output terminal of the amplifier 130 and the capacitor is grounded.

The impedance of the harmonic-termination circuit 140A (LC series resonant circuit) is lowest at a resonant frequency f of $1/2\pi\sqrt{LC}$, where C is the capacitance of the capacitor 200 and L is the inductance of the inductor 210. Therefore, the capacitance C and the inductance L are adjusted in order that the harmonic-termination circuit 140A has a low impedance (for example, substantially 0) at the frequency of a prescribed harmonic of the amplified signal RFout and as a result the harmonic can be controlled so as to be short-circuited.

Specifically, for example, in the case where the power amplification module 100A is made to operate using the APT mode, the capacitance C of the capacitor 200 is given a large value (first value). Thus, the resonant frequency f of the harmonic-termination circuit 140A is low. Therefore, the amplifier 130 can be controlled to perform class-F operation by adjusting the resonant frequency f to be substantially equal to the frequency of an even-ordered harmonic (for example, second order) of the amplified signal RFout so that the even-ordered harmonic is short-circuited. On the other hand, in the case where the power amplification module 100A is made to operate using the ET mode, the capacitance C of the capacitor 200 is given a small value (second value). Thus, the resonant frequency f of the harmonic-termination circuit 140A is high. Therefore, the amplifier 130 can be controlled to perform inverse-class-F operation by adjusting the resonant frequency f to be substantially equal to the frequency of an odd-ordered harmonic (for example, third order) of the amplified signal RFout so that the odd-ordered harmonic is short-circuited.

The harmonic to be short-circuited is not limited to a second order wave or a third order wave and it is sufficient that a configuration be adopted in which an even-ordered harmonic of the second order or higher is short-circuited in the case of the APT mode and an odd-ordered harmonic of the third order or higher is short-circuited in the case of the ET mode.

A matching network 150A includes an inductor 211 and a capacitor 201 and forms an L-type matching network. Specifically, one end of the inductor 211 (second inductor) is connected to the output terminal of the amplifier 130 and the other end of the inductor 211 is connected to one end of the capacitor 201. The one end of the capacitor 201 (third capacitor) is connected to the other end of the inductor 211 and the other end of the capacitor 201 is grounded.

It is possible to change the capacitance of the capacitor 201 in accordance with the control signal Scont in the matching network 150A as well, similarly as to in the harmonic-termination circuit 140A. This is because, since the output impedance of the amplifier 130 with respect to the fundamental wave also changes in accordance with switching of the operation of the amplifier 130, the impedance of the matching network 150A also can be controlled in accordance with the operation of the amplifier 130. In the power amplification module 100A, an example configuration is illustrated in which the impedance of the matching network 150A can also be controlled, similarly to the harmonic-termination circuit 140A, but a configuration may instead be adopted in which only the impedance of the harmonic-termination circuit 140A can be controlled.

Furthermore, in the harmonic-termination circuit 140A, the inductance may be changed instead of the capacitance or both the capacitance and the inductance may be changed in order to control the impedance of the harmonic-termination circuit 140A. However, the inductance can be made as small as possible and that the capacitance be able to be changed for the following reasons.

Firstly, it is necessary that the input impedance of the harmonic-termination circuit 140A be made lower than the output impedance of the amplifier 130 in order to short-circuit a harmonic, but the output impedance of the amplifier 130 is generally comparatively low (for example, around several Ω) in a mobile communication device. Consequently, the inductance can be small in order to ensure that the input impedance is lower than the output impedance in a band in the vicinity of the resonant frequency.

Secondly, power loss due to an inductor is greater than power loss due to a capacitor in an LC series resonant circuit. Accordingly, the inductance can be small in order to suppress power loss in the harmonic-termination circuit 140A.

As described above, the power amplification module 100A illustrated in FIG. 4 can switch the operation of the amplifier 130 by controlling the input impedance of the harmonic-termination circuit 140A in accordance with the operation mode of the power amplification module. Thus, the characteristics of the amplifier 130 are controlled in accordance with the operation mode of the power amplification module and the amplifier 130 operates so as to satisfy the specifications required by the different operation modes. Therefore, a power amplification module can be provided in which the characteristics of the power amplifier can be controlled in accordance with the operation mode. In addition, the power amplification module 100A can match the output impedance of the amplifier 130 and the input impedance of the subsequent circuit with respect to the fundamental wave of the amplified signal RFout by controlling the input impedance of the matching network 150A. Therefore, the power adding efficiency of the power amplification module 100A can be further improved.

Next, an example of a method of controlling the capacitances of the harmonic-termination circuit 140A and the matching network 150A will be described while referring to FIGS. 5A and 5B.

Figure 5A:
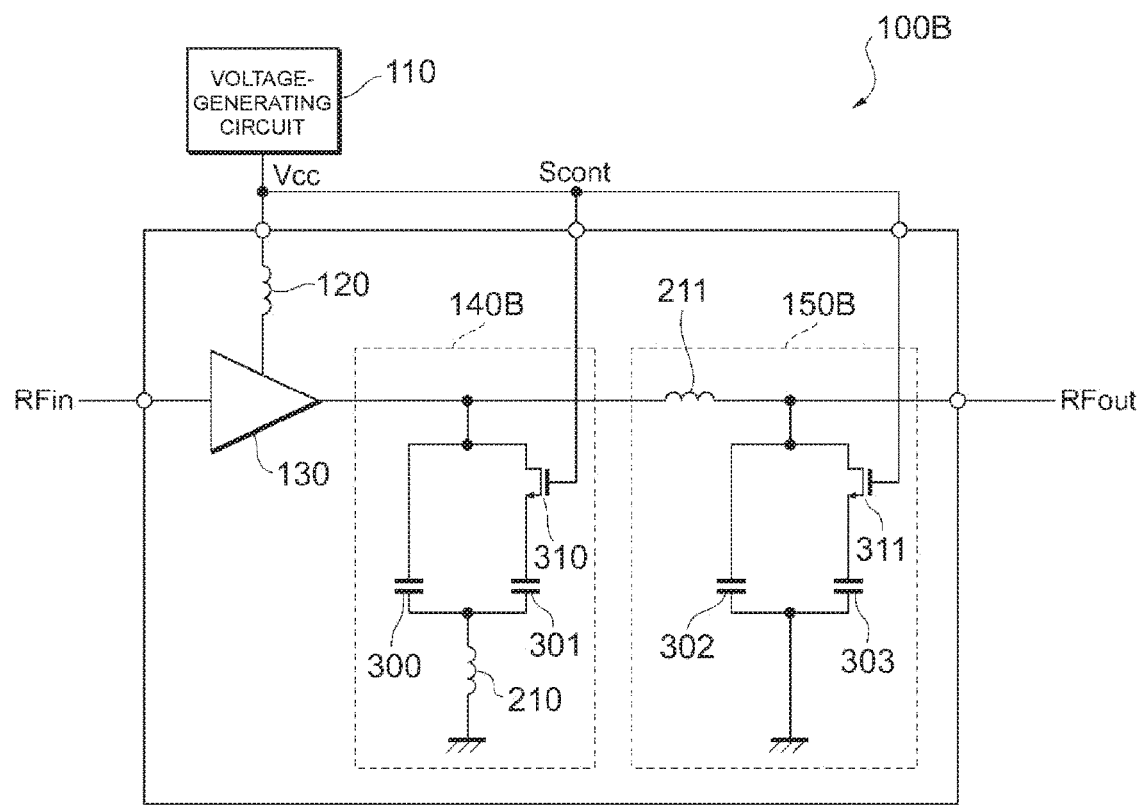
FIG. 5A illustrates an example of the configuration of the power amplification module in a case where the power amplification module is made to operate in an APT mode.

FIG. 5A illustrates an example configuration of the power amplification module 100 according to the embodiment of the present disclosure (power amplification module 100B) in a case where the power amplification module 100 is made to operate in the APT mode. As illustrated in FIG. 5A, the power amplification module 100B includes a harmonic-termination circuit 140B and a matching network 150B instead of the harmonic-termination circuit 140A and the matching network 150A illustrated in FIG. 4.

In the harmonic-termination circuit 140B, the capacitor 200 illustrated in FIG. 4 is formed of capacitors 300 and 301 and an FET 310. Specifically, the capacitors 300 (first capacitor) and 301 (second capacitor) are connected in parallel with each other and are connected between the output terminal of the amplifier 130 and the inductor 210 (first inductor).

The FET 310 (first switch circuit) is connected in series with either of the capacitors 300 and 301 (capacitor 301 in FIG. 5A). The control signal Scont is supplied to the gate of the FET 310 and the FET 310 is switched on and off in accordance with the control signal Scont. Thus, when the FET 310 is switched on, charge accumulates in the capacitor 301 and the combined capacitance of the capacitors 300 and 301 becomes larger. On the other hand, when the FET 310 is switched off, charge does not accumulate in the capacitor 301 and the combined capacitance of the capacitors 300 and 301 becomes smaller. Therefore, the harmonic-termination circuit 140B can change the combined capacitance in accordance with the control signal Scont.

The FET 310 is used in this embodiment to make the capacitance changeable because a configuration in which a switch element is used is optional when considering integration into a semiconductor chip. The FET 310 is an example of a switch element, but another element having a switching function may be used instead of the FET 310.

In the matching network 150B, the capacitor 201 illustrated in FIG. 4 is formed of capacitors 302 (third capacitor) and 303 (fourth capacitor) and an FET 311 (second switch circuit). The configuration for enabling the combined capacitance of the matching network 150B to be changed is the same as that of the harmonic-termination circuit 140B and therefore detailed description thereof is omitted.

A voltage at which the FETs 310 and 311 are switched on is used as the control signal Scont supplied to the harmonic-termination circuit 140B and the matching network 150B. Here, in the power amplification module 100B, the power supply voltage Vcc is controlled using the APT mode and consequently variations in the power supply voltage Vcc are smaller than in the ET mode. Therefore, for example, a power supply voltage terminal and a control signal terminal are connected to each other and the power supply voltage Vcc can be used as the control signal Scont. Thus, the amplifier 130 can be made to perform class-F operation by controlling the capacitances of the harmonic-termination circuit 140B and the matching network 150B and short-circuiting the second-order harmonic as described above by using a simple configuration. In addition, the input impedance of the matching network 150A can be adjusted in accordance with operation of the amplifier 130.

Figure 5B:
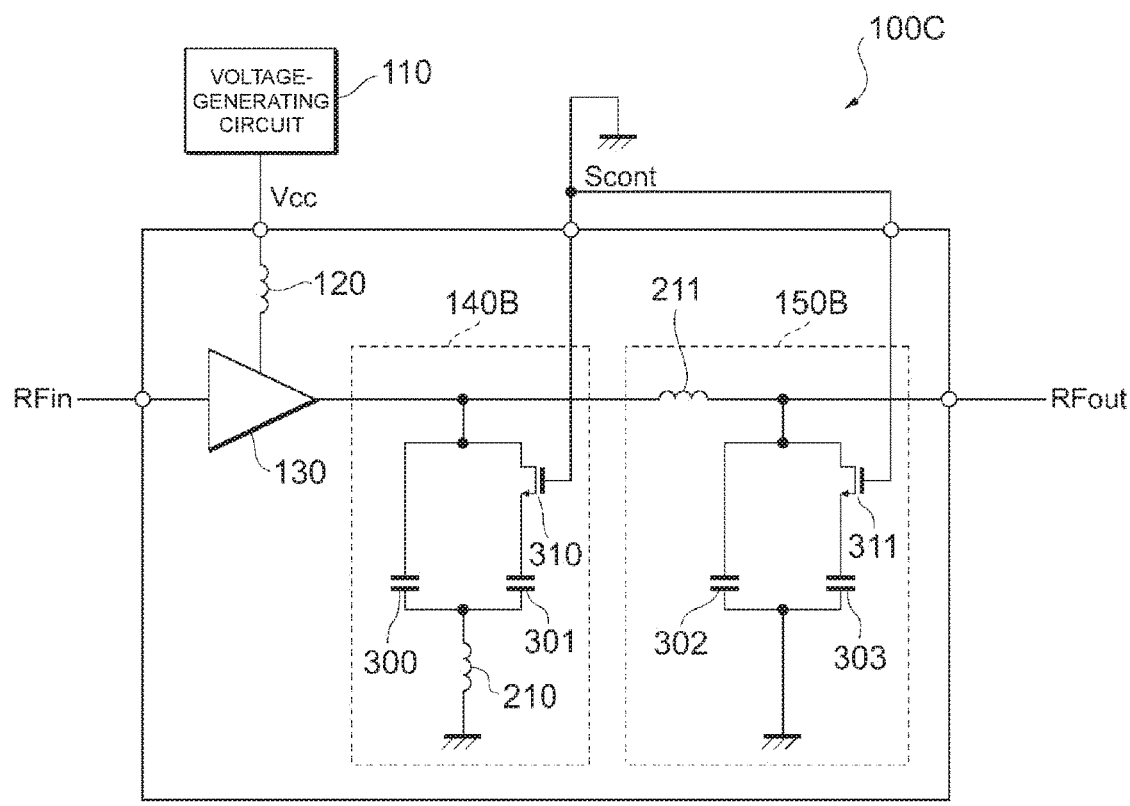
FIG. 5B illustrates an example of the configuration of the power amplification module in a case where the power amplification module is made to operate in an ET mode.

FIG. 5B illustrates an example configuration of the power amplification module 100 according to the embodiment of the present disclosure (power amplification module 100C) in a case where the power amplification module 100 is made to operate in the ET mode.

As illustrated in FIG. 5B, a voltage at which the FETs 310 and 311 are switched off (for example, a reference potential) is used as the control signal Scont supplied to the harmonic-termination circuit 140B and the matching network 150B in the power amplification module 100C in contrast to the power amplification module 100B illustrated in FIG. 5A.

Thus, charge does not accumulate in the capacitors 301 and 303 and the combined capacitances of the harmonic-termination circuit 140B and the matching network 150B become smaller. Therefore, the amplifier 130 can be controlled so as to perform inverse-class-F operation by short-circuiting the third-order harmonic as described above. In addition, the input impedance of the matching network 150A can be adjusted in accordance with operation of the amplifier 130.

In the power amplification modules 100B and 100C, examples are illustrated in which the control signal Scont is supplied to both the harmonic-termination circuit 140B and the matching network 150B, but a configuration may instead be adopted in which different control signals are supplied to the harmonic-termination circuit 140B and the matching network 150B. In addition, a switching circuit for realizing switching between the operation illustrated in FIG. 5A and the operation illustrated in FIG. 5B may be built into the power amplification module.

Figure 6:
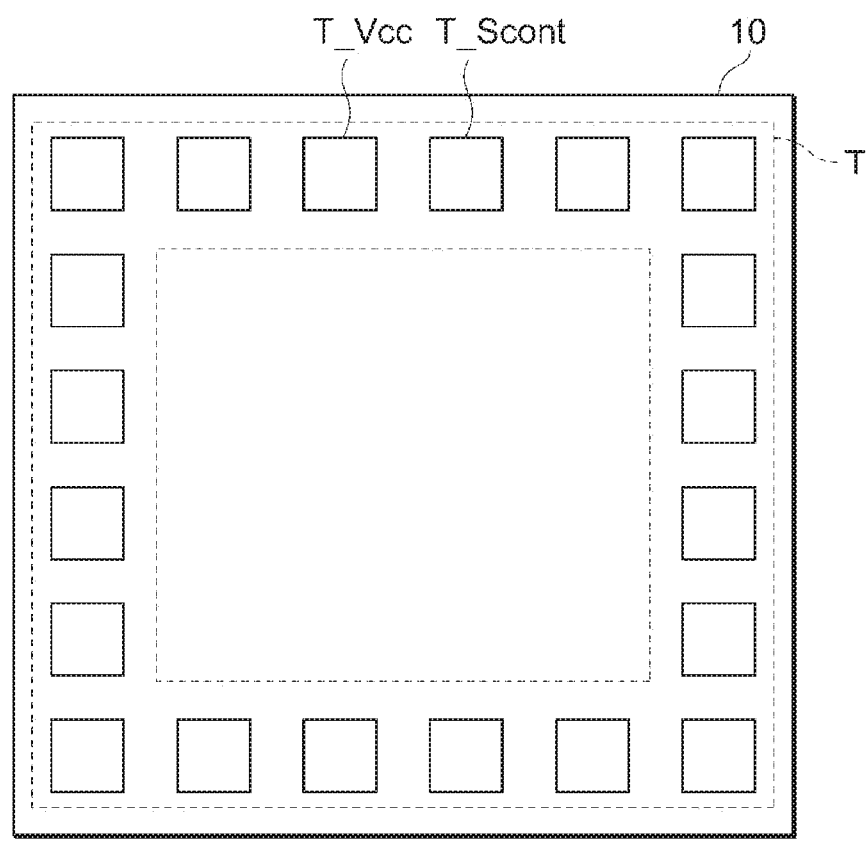
FIG. 6 schematically illustrates an example of the arrangement of terminals in the power amplification module.

FIG. 6 schematically illustrates an example of the arrangement of terminals in the power amplification module 100 according to the embodiment of the present disclosure.

An integrated circuit 10 is an integrated circuit on which the amplifier 130 is mounted. The integrated circuit 10 has, in a peripheral region of one surface thereof, a plurality of terminals T including a power supply voltage terminal T_Vcc and a control signal terminal T_Scont.

The power supply voltage terminal T_Vcc (first terminal) is a terminal to which the power supply voltage Vcc is supplied in the power amplification module 100. The control signal terminal T_Scont (second terminal) is a terminal to which the control signal Scont is supplied in the power amplification module 100. The power supply voltage terminal T_Vcc and the control signal terminal T_Scont are arranged comparatively close to each other (for example, adjacent to each other). Thus, in the case where the power supply voltage terminal T_Vcc and the control signal terminal T_Scont are connected to each other and the power supply voltage Vcc is used as the control signal Scont, the work involved in connecting the terminals is simple.

Exemplary embodiments of the present disclosure have been described above. The power amplification modules 100, 100A, 100B and 100C each include a power amplifier that can be used in both the APT mode and the ET mode and a harmonic-termination circuit 140 having an impedance that can be controlled. Thus, either an even-ordered harmonic or an odd-ordered harmonic of the third order or higher can be short-circuited. Therefore, operation of the amplifier 130 can be switched in accordance with the operation mode of the power amplification module and a power amplification module can be provided in which the characteristics of the power amplifier can be controlled in accordance with the operation mode.

In addition, in the power amplification module 100A, the harmonic-termination circuit 140A is formed of an LC series resonant circuit that includes the capacitor 200 and the inductor 210. Thus, the frequency of a harmonic to be short-circuited can be adjusted by controlling the impedance of the harmonic-termination circuit 140A such that the resonant frequency of the LC series resonant circuit is equal to the frequency of the harmonic of the amplified signal RFout that is to be short-circuited.

Furthermore, the power amplification modules 100B and 100C each include the parallel-connected capacitors 300 and 301 and a switch circuit (FET 310) as the harmonic-termination circuit 140B. Thus, the combined capacitance of the harmonic-termination circuit 140B can be controlled using the FET 310.

In addition, the power amplification modules 100B and 100C use the power supply voltage Vcc or a reference potential as the control signal Scont, which is for controlling the capacitance of the harmonic-termination circuit 140B. Thus, operation of the amplifier 130 can be switched using a simple configuration.

Furthermore, the power amplification modules 100, 100A, 100B and 100C include the matching network 150 having an impedance that can be controlled. In addition, the matching network 150 can be formed of an L-type matching network that includes the capacitor 201 and the inductor 211. Thus, the output impedance of the amplifier 130 and the input impedance of a subsequent stage with respect to the fundamental wave of the amplified signal RFout can be matched in accordance with the operation of the amplifier 130 and the power adding efficiency can be further improved.

Furthermore, the power amplification modules 100B and 100C each include the parallel-connected capacitors 302 and 303 and a switch circuit (FET 311) as the matching network 150B. Thus, the combined capacitance of the matching network 150B can be controlled using the FET 311.

In addition, the power amplification modules 100B and 100C use the power supply voltage Vcc or a reference potential as the control signal Scont, which is for controlling the capacitance of the matching network 150B. Thus, the impedance of the matching network 150B can be controlling with a simple configuration.

In addition, in the integrated circuit 10, the power supply voltage terminal T_Vcc and the control signal terminal T_Scont are arranged comparatively close to each other (for example, adjacent to each other). Thus, the power supply voltage Vcc can be used as the control signal Scont by performing simple connection work.

The purpose of the embodiments described above is to enable easy understanding of the present disclosure and the embodiments are not to be interpreted as limiting the present disclosure. The present disclosure can be changed or improved without departing from the gist of the disclosure and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   an amplifier that amplifies an input signal and outputs an amplified signal according to a first mode or a second mode; and
   a harmonic-termination circuit that controls an impedance in accordance with a frequency of a harmonic of the amplified signal, the amplified signal being input to the harmonic-termination circuit,
   wherein the harmonic-termination circuit is an LC series resonant circuit that comprises a first capacitor and a first inductor connected in series with each other between an output terminal of the amplifier and a reference potential,
   wherein a resonant frequency of the LC series resonant circuit becomes substantially equal to a frequency of an even-ordered harmonic of the amplified signal when the amplifier operates in the first mode, and becomes substantially equal to a frequency of an odd-ordered harmonic of the amplified signal when the amplifier operates in the second mode,
   wherein the resonant frequency of the LC series resonant circuit is adjusted by adjusting a capacitance of the first capacitor or an inductance of the first inductor,
   wherein when the power amplifier operates in the first mode, a power supply voltage of the amplifier changes in accordance with an average value of a voltage of the amplified signal over a prescribed time period, and
   wherein when the power amplifier operates in the second mode, the power supply voltage of the power amplifier changes in accordance with a waveform of an envelope of the input signal.

2. The power amplification module according to claim 1, wherein the harmonic-termination circuit is configured to:
   short circuit at least one even-ordered harmonic of the amplified signal when the amplifier operates in the first mode, and
   short circuit at least one odd-ordered harmonic of a third order or higher of the amplified signal when the amplifier operates in the second mode.

3. The power amplification module according to claim 1, wherein the LC series resonant circuit further comprises:
   a second capacitor connected in parallel with the first capacitor, and
   a first switch circuit connected in series with the first or second capacitor,
   wherein the first switch circuit is controlled by a first control signal supplied in accordance with the operation of the amplifier in the first mode or the second mode such that a capacitance of the LC series resonant circuit is controlled to be a first value when the amplifier operates in the first mode and the capacitance of the LC series resonant circuit is controlled to be a second value when the power amplification module operates in the second mode, and
   wherein the second value is smaller than the first value.

4. The power amplification module according to claim 3, wherein the power supply voltage is the first control signal when the amplifier operates in the first mode and the reference potential is the first control signal when the power amplification module operates in the second mode.

5. The power amplification module according to claim 1, further comprising:

a matching network provided between the amplifier and an output terminal of the amplification module, the matching network comprising a second inductor and a third capacitor, wherein the amplified signal is supplied to a first end of the second inductor, and wherein a first end of the third capacitor is connected to a second end of the second inductor, and a second end of the third capacitor is grounded.

6. The power amplification module according to claim 2, further comprising:

a matching network provided between the amplifier and an output terminal of the amplification module, the matching network comprising a second inductor and a third capacitor, wherein the amplified signal is supplied to a first end of the second inductor, and wherein a first end of the third capacitor is connected to a second end of the second inductor, and a second end of the third capacitor is grounded.

7. The power amplification module according to claim 3, further comprising:

a matching network provided between the amplifier and an output terminal of the amplification module, the matching network comprising a second inductor and a third capacitor, wherein the amplified signal is supplied to a first end of the second inductor, and wherein a first end of the third capacitor is connected to a second end of the second inductor, and a second end of the third capacitor is grounded.

8. The power amplification module according to claim 5, wherein the matching network further comprises a fourth capacitor connected in parallel with the third capacitor, and a second switch circuit connected in series with the third or fourth capacitor, and wherein the second switch circuit is controlled by a second control signal supplied in accordance with the operation of the amplifier in the first mode or the second mode.

9. The power amplification module according to claim 6, wherein the matching network further comprises a fourth capacitor connected in parallel with the third capacitor, and a second switch circuit connected in series with the third or fourth capacitor, and wherein the second switch circuit is controlled by a second control signal supplied in accordance with the operation of the amplifier in the first mode or the second mode.

10. The power amplification module according to claim 7, wherein the matching network further comprises a fourth capacitor connected in parallel with the third capacitor, and a second switch circuit connected in series with the third or fourth capacitor, and wherein the second switch circuit is controlled by a second control signal supplied in accordance with the operation of the amplifier in the first mode or the second mode.

11. The power amplification module according to claim 8, wherein the harmonic-termination circuit is a resonant circuit connected between an output terminal of the amplifier and a reference potential, wherein the power supply voltage serves as the second control signal when the power amplification module operates in the first mode, and wherein the reference potential serves as the second control signal when the power amplification module operates in the second mode.

12. The power amplification module according to claim 9, wherein the power supply voltage serves as the second control signal when the power amplification module operates in the first mode, and wherein the reference potential serves as the second control signal when the power amplification module operates in the second mode.

13. The power amplification module according to claim 10, wherein the power supply voltage serves as the second control signal when the power amplification module operates in the first mode, and wherein the reference potential serves as the second control signal when the power amplification module operates in the second mode.

14. The power amplification module according to claim 3, wherein the power amplification module is formed as part of an integrated circuit, the integrated circuit having a first terminal to which the power supply voltage is supplied and a second terminal to which the first control signal is supplied, and wherein the first terminal is adjacent to the second terminal.

* * * * *